(12) United States Patent
Avazi et al.

(10) Patent No.: US 7,098,757 B2
(45) Date of Patent: Aug. 29, 2006

(54) ELECTRICALLY-COUPLED MICRO-ELECTRO-MECHANICAL FILTER SYSTEMS AND METHODS

(75) Inventors: Farrokh Avazi, Atlanta, GA (US); Siavash Pourkamali Anaraki, Tehran (IR)

(73) Assignee: Georgia Tech Research Corporation, Atlanta, GA (US)

(*) Notice: Subject to any disclaimer, the term of this patent is extended or adjusted under 35 U.S.C. 154(b) by 40 days.

(21) Appl. No.: 10/669,178

(22) Filed: Sep. 23, 2003

(65) Prior Publication Data
US 2004/0058591 A1 Mar. 25, 2004

Related U.S. Application Data

(60) Provisional application No. 60/412,721, filed on Sep. 23, 2002.

(51) Int. Cl.
*H03H 9/00* (2006.01)
*H03H 9/205* (2006.01)

(52) U.S. Cl. .................. 333/186; 333/197
(58) Field of Classification Search .......... 333/186, 333/197, 198, 133; 310/309
See application file for complete search history.

(56) References Cited

U.S. PATENT DOCUMENTS

| 3,858,127 | A | * | 12/1974 | Johnson ............... 333/198 |
| 5,839,062 | A | | 11/1998 | Nguyen et al. ......... 455/323 |
| 5,933,061 | A | | 8/1999 | Takamoro et al. ........ 333/189 |
| 6,125,271 | A | | 9/2000 | Rowland, Jr. ........... 455/313 |
| 6,424,074 | B1 | * | 7/2002 | Nguyen ............... 310/309 |
| 6,466,106 | B1 | | 10/2002 | Gamo ................ 333/189 |
| 6,535,766 | B1 | * | 3/2003 | Thompson et al. ........ 607/60 |
| 6,549,099 | B1 | | 4/2003 | Taussig ............... 333/186 |
| 6,563,402 | B1 | | 5/2003 | Kundu ............... 333/202 |
| 6,621,134 | B1 | * | 9/2003 | Zurn ................. 257/415 |
| 6,628,177 | B1 | | 9/2003 | Clark et al. ........... 333/186 |
| 6,894,586 | B1 | * | 5/2005 | Bircumshaw et al. ...... 333/133 |
| 6,900,575 | B1 | | 5/2005 | Olkhovets et al. ........ 310/309 |
| 2003/0129957 | A1 | | 7/2003 | Shingaki et al. ......... 455/307 |

FOREIGN PATENT DOCUMENTS

| JP | 63-232610 A | 9/1988 |
| WO | WO 02/01717 A1 | 1/2002 |
| WO | WO 03/043189 A2 | 5/2003 |

OTHER PUBLICATIONS

Pourkamali, Electrically Coupled MEMS Bandpass Filters, Apr. 2004, Georgia School of Technology, 83 pages.*
De Los Santos, MEMS For RF/Microwave Wireless Applications: The Next Wave—Part II, Jul. 2001, Microwave Journal, 6 pages.*
International Search Report.

(Continued)

*Primary Examiner*—Dean Takaoka
(74) *Attorney, Agent, or Firm*—Thomas, Kayden, Horstemeyer & Risley, LLP

(57) ABSTRACT

An electrically-coupled micro-electro-mechanical system (MEMS) filter system and method are disclosed. In one embodiment, the MEMS filter system comprises a first microelectromechanical system (MEMS) resonator comprising a first resonating element, a second MEMS resonator comprising a second resonating element, the sescond resonating element closely spaced and mechanically separate from the first resonating element, wherein the first MEMS resonator is coupled to the second MEMS resonator through the electrostatic force acting between resonating portions of the MEMS resonators, and additional MEMS resonators electrically coupled to the first MEMS resonator, the second MEMS resonator, or the first and second MEMS resonators.

18 Claims, 16 Drawing Sheets

OTHER PUBLICATIONS

Galayko, D., Kaiser, A., Buchaillot, L. et al. (2003) Microelectromechanical Variable-Bandwidth IF Frequency Filters With Tunable Electrostatical Coupling Spring. IEEE., pp. 153-156.

No, S.Y., Hashimura, A., Pourkamali, S. et al., Single-Crystal Silicon HARPSS Capacitive Resonators with Submicron Gap-Spacing, School of Electrical and Computer Engineering, Georgia Institute of Technology, GA; for proceedings at Hilton Head 2002.

Wang, K., Bannon, F.D., Clark, J.R. et al. (1997) Q-Enhancement of Microelectromechanical Filters Via Low-Velocity Spring Coupling., Proceedings, IEEE International Ultrasonics Symposium, Toronto, Canada, Oct. 5-8, 1997, pp. 323-327.

Wang, K. and Nguyen, T.C. (1997) High-Order Micromechanical Electronic Filters, Proceedings, IEEE International Micro Electro Mechanical Systems Workshop, Nagoya, Japan, Jan. 26-30, 1997, pp. 25-30.

Pourkamali, et al. A 600kHz Electrically-Coupled MEMS Bandpass Filer, School of Electrical and Computer Engineering, Georgia Institute of Technology, GA, MEMS 2003 Conference, Kyoto Japan, Jan. 19-23, 2003.

Pourkamali, et al. Electrostatically Coupled Micromechanical Beam Filters, School of Electrical and Computer Engineering, Georgia Institute of Technology, GA, MEMS 2003 Conference, Kyoto, Japan, Jan. 19-23, 2003, pp. 702-705.

Ayazi, Farrokh, et al., Capacitive Resonators And Methods Of Fabrication, filed on Jul. 31, 2003, U.S. Appl. No. 10/632,176.

Pourkamali, S., Abdolvand, R., Hashimura, A. et al. HARPSS Single Crystal Silicon Filter Arrays. School of Electrical and Computer Engineering, Georgia Institute of Technology, GA, Jun. 2002.

* cited by examiner

BEFORE TUNING

AFTER TUNING

US 7,098,757 B2

ELECTRICALLY-COUPLED MICRO-ELECTRO-MECHANICAL FILTER SYSTEMS AND METHODS

CROSS-REFERENCE TO RELATED APPLICATION

This application claims the benefit of U.S. Provisional Application No. 60/412,721, filed Sep. 23, 2002, which is entirely incorporated herein by reference.

This application is related to copending U.S Utility patent application entitled "Capacitive Resonators and Methods of Fabrication," having Ser. No. 10/632,176, filed on the Jul. 31, 2003, which is entirely incorporated herein by reference.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of Contract No. DAAH01-01-1-R004 awarded by the U.S. Army.

TECHNICAL FIELD

The present invention is generally related to MEMS (micro-electro-mechanical systems) technology, and, more particularly, is related to MEMS filter systems and methods.

BACKGROUND OF THE INVENTION

Advanced consumer electronics such as miniature radios and wristwatch cellular phones pose severe limitations on the size and cost of frequency selective units (e.g., frequency references and filters) contained therein. MEMS (micro-electro-mechanical systems) resonators are receiving increased attention as building blocks for integrated filters and frequency references to replace bulky, off-chip ceramic and SAW (surface acoustic wave) devices, among others. Small size, low power consumption and ease of integration with microelectronic circuits constitute some major advantages associated with the use of MEMS resonators.

To achieve the desired frequency selectivity, high-order bandpass filters consisting of a plurality of mechanically-coupled resonators are typically used. Mechanical coupling techniques, traditionally used for implementation of high-order filters from individual mechanical resonators, have been applied to micromechanical resonators for filter synthesis. Electrostatically sensed and actuated MEMS filters up to the third order with center frequencies up to 68 mega-Hertz (MHz) as well as electrostatically actuated and optically sensed filters up to the $20^{th}$ order at center frequencies of a few MHz have been reported using mechanical coupling techniques.

Mechanical coupling techniques can present obstacles to performance in some applications. For example, in the ultra-high frequency (UHF) range (e.g., 0.3–3 giga-Hertz (GHz)) and above, which is a band of interest for many wireless applications, due to the very small size of the resonator element (approximately less than 10 micro-meters ($\mu$m)), mechanical coupling may require sub-micron in size coupling elements (e.g., wires) that are difficult to fabricate using optical lithography. In addition, filter characteristics are largely dependent on the positioning and/or dimensions of the coupling elements and optimized design of a filter often requires mechanical design expertise and/or specialized simulation tools.

Thus, a need exists in the industry to address the aforementioned and/or other deficiencies and/or inadequacies.

SUMMARY OF THE INVENTION

Embodiments of the present invention provide for an electrically-coupled micro-electro-mechanical system (MEMS) filter system.

In this regard, one embodiment of such a system, among others, includes a first MEMS resonator comprising a first resonating element, and a second MEMS resonator comprising a second resonating element, the second resonating element closely spaced and mechanically separate from the first resonating element, wherein the second MEMS resonator is electrically coupled to the first MEMS resonator; and additionally MEMS resonators electrically coupled to the first MEMS resonator, the second MEMS resonator, or the first and second MEMS resonators.

Other systems, methods, features, and advantages of the present invention will be or become apparent to one with skill in the art upon examination of the following drawings and detailed description. It is intended that all such additional systems, methods, features, and advantages be included within this description, be within the scope of the systems and methods, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the systems and methods. Moreover, in the drawings, like reference numerals designate corresponding parts throughout the several views.

DETAILED DESCRIPTION OF THE PREFERRED EMBODIMENTS

Figure 1:
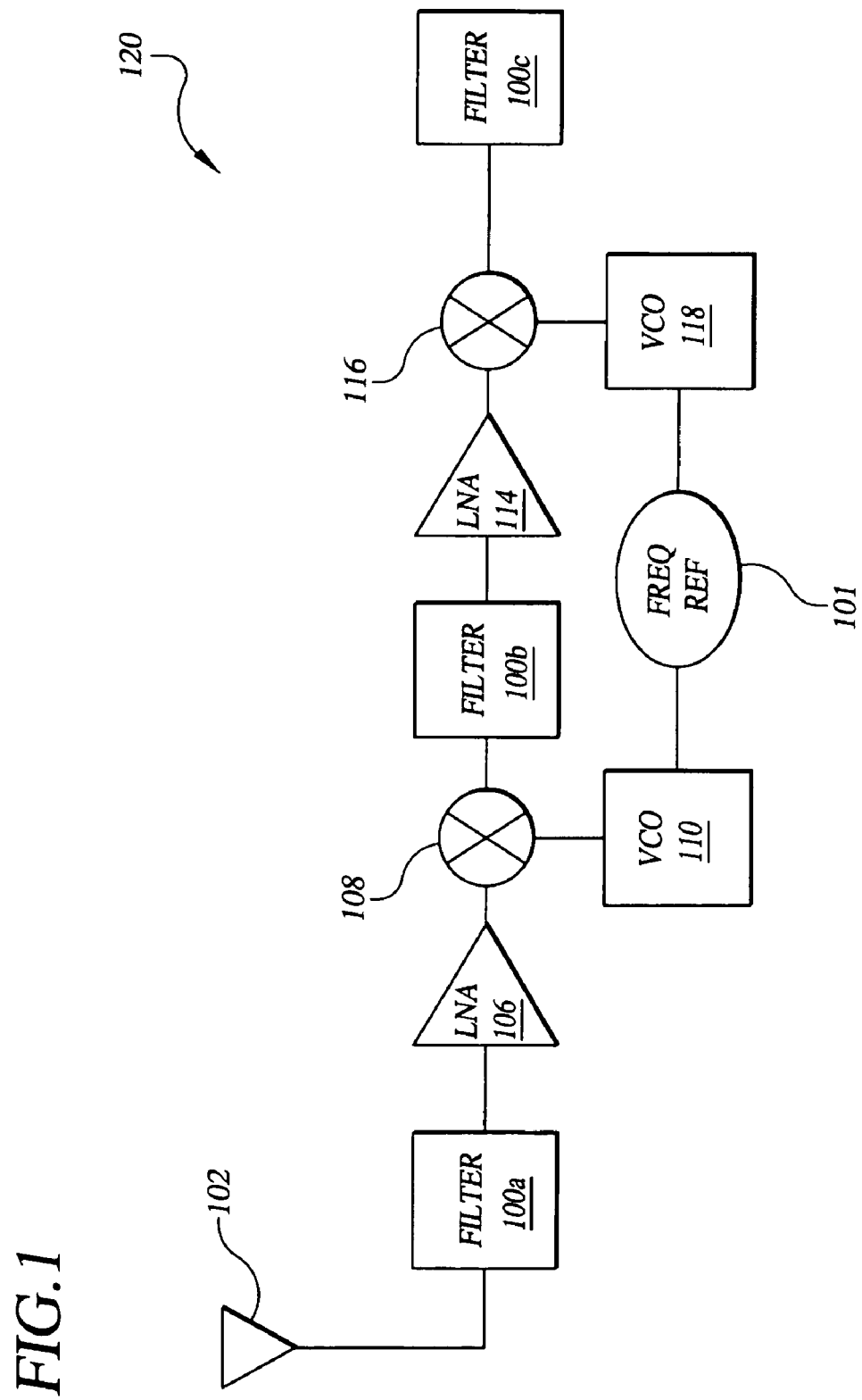
FIG. 1 is a schematic diagram that illustrates one example implementation for the preferred embodiments of the invention.

Preferred embodiments of electrically-coupled MEMS (micro-electro-mechanical systems) resonator filter systems and methods are disclosed. In particular, filter synthesis methods and systems derived thereof are disclosed. The filter synthesis methods provide a technique for electrically coupling high quality factor (Q), single-crystal silicon MEMS resonators. Q can generally be described as a measure of energy stored in a system divided by the energy dissipated in the system. Q can be characterized in terms of frequency response of a resonator, such as the ratio of the center frequency ($f_0$) to the 3-dB (decibel) bandwidth of the resonator device. The filter synthesis methods simplify the implementation of MEMS filter design, fabrication, and/or frequency scaling. For example, the filter synthesis methods do not require mechanical design expertise to implement, and can be designed by electrical engineers using available circuit simulation techniques (e.g., SPICE). In addition, electrically-coupled filter characteristics are less process-dependent compared to their mechanically-coupled counterparts.

Each MEMS resonator is equivalent to a high-Q series RLC (resistor-inductor-capacitor) circuit in the electrical domain. In one embodiment, electrically-coupled MEMS resonator filters (herein electrically-coupled MEMS filter systems or electrically-coupled filter systems) of the preferred embodiments include resonators that are cascaded with one or more shunt-capacitors (shunted to ground) disposed in between adjacent resonators. In another embodiment, a capacitance effect is created between adjacent resonators that is referred to as series configuration. The capacitors for the shunt configuration or the effective series capacitance are herein referred to as coupling capacitors and coupling capacitance, respectively. Another embodiment includes cascaded resonators with one or more active components (e.g., transistors) disposed between adjacent resonators. Other embodiments can include a combination of one or more of the above mentioned embodiments. For example, coupling capacitors in a shunt configuration can be integrated with active components.

The use of active components, coupling capacitors, and/or coupling capacitance disposed between adjacent resonators results in what is herein referred to as electrically-coupled MEMS filter systems (and corresponding methods). Interaction of the coupling capacitors, coupling capacitance, and/or active components and the resonators' equivalent RLC circuits can result in one or more resonance modes in the entire filter system (and a multiple-order bandpass frequency response). The filter synthesis methods enable MEMS filter systems for very-high frequency (VHF) and ultra-high frequency (UHF) applications, among other frequency ranges. Electrically-coupled MEMS filters with operating frequencies into the giga-Hertz (GHz) range can be implemented using high-Q MEMS resonators that are available in the GHz frequency range.

The choice of coupling capacitor values depend on the frequency of operation, required filter bandwidth, and/or motional resistance of the resonators, and can range in value from hundreds of femtofarads (fF) to a few pico-farads (pF). Such values for on-chip coupling capacitors, for example, are available in practically any MEMS or CMOS (complementary metal oxide semiconductor) process without occupying a large area on the chip. For embodiments including active components, transistors with operating frequencies well into the GHz range are readily available.

In the description that follows, an example implementation for MEMS filter systems of the preferred embodiments will be described, followed by second and third order electrically-coupled MEMS filter systems along with equivalent models and frequency response performance. Additionally, several embodiments of electrically-coupled MEMS filter systems are described and illustrated.

The preferred embodiments of the invention may, however, be embodied in many different forms and should not be construed as limited to the embodiments set forth herein; rather, these embodiments are provided so that this disclosure will be thorough and complete, and will fully convey the scope of the invention to those having ordinary skill in the art. For example, although described using an electrically-coupled, in-plane resonator beam, other devices can be used such as piezoelectric devices with other shapes, vibration modes and structures (and other methods of fabricating the structures).

FIG. 1 is a schematic diagram that illustrates one example implementation for the preferred embodiments of the invention. Select receiver components of a communication device 120 are shown, with the understanding that transmitter components can also benefit from the embodiments of the invention. The communication device 120 can be embodied as a portable transceiver, such as a cellular phone, among other devices. The communication device 120 includes an antenna 102, electrically-coupled MEMS filter systems 100a–100c configured as frequency selective filters, low-noise amplifiers (LNAs) 106 and 114, mixers 108 and 116, voltage-controlled oscillators (VCOs) 110 and 118, and a frequency reference device 101. All components shown except for the electrically-coupled MEMS filter systems 100a–100c are known, and thus further explanation is omitted for brevity. The use of electrically-coupled MEMS filter systems 100a–100c can result in a reduction in the number of components in the communication device 120. Electrically-coupled MEMS filter systems 100a–100c are very selective at high frequencies, thus substantially obviating the need for pre-amplifier selection and other frequency transformation and/or amplification devices that operate to provide signal processing at frequencies that current devices most efficiently operate under. The electrically-coupled MEMS filter systems of the preferred embodiments possess high quality factors at high frequencies, enabling frequency selection with substantially fewer components.

Figure 2A:
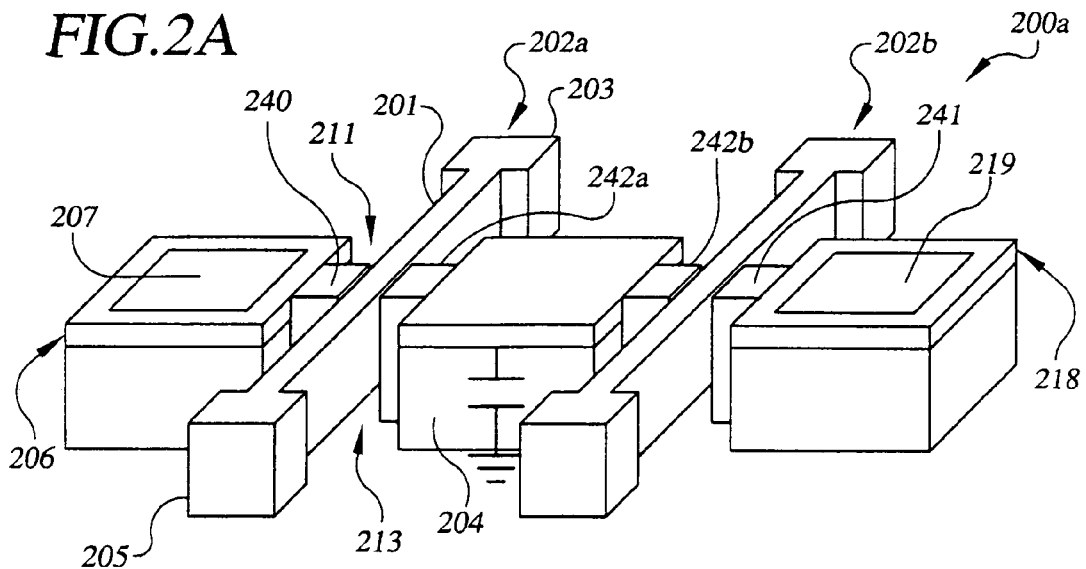
FIG. 2A is a schematic diagram of an embodiment of an example electrically-coupled micro-electro-mechanical system (MEMS) second order filter system.

FIG. 2A is a block diagram of an embodiment of an example MEMS filter system configured as a plurality of electrically-coupled, in-plane, clamped-clamped beam resonators. The electrically-coupled MEMS filter system 200a comprises two single crystal silicon (SCS) resonators 202a and 202b that are coupled to each other via coupling capacitor element 204 (e.g., created on the substrate). The first resonator 202a comprises a first order filter, and the combination of the first resonator 202a and the second resonator 202b comprises a second order filter. Using the resonator 202a as a representative illustration of the structure for each resonator 202a–b, the resonator 202a includes a SCS beam 201 disposed between two clamped regions 203 and 205. The SCS beam 201 functions as the resonating element for resonator 202a. A drive electrode 206 comprises an input pad (e.g., metal pad) 207 and an electrode (e.g., polysilicon) 240. A sense electrode 218 includes an output pad (e.g., metal pad) 219 and an electrode (e.g., polysilicon) 241. Note that the embodiment shown in FIG. 2A is one example of many, and components can be omitted, added, and/or variations in material can be used in other embodiments. For example, although shown with input and output pads 207 and 219 for wire-bonding, such pads may be omitted where wire-bonding is not used (e.g., in fully-integrated embodiments). Similarly, although the electrodes, such as electrodes 240 and 241, are described using poly-silicon as an example, other material may be used, such as single-crystal silicon or metal, among others. The drive electrode 206 and coupling capacitor element 204 oppose one another. The sense electrode 218 is disposed adjacent to resonator 202b. The coupling capacitor element 204 comprises electrodes 242a and 242b (e.g., polysilicon) disposed adjacent to the resonator beam 201 (and corresponding resonator beam of resonator 202b). The electrodes 240 and 242a are separated from the SCS beam 201 by gaps 211 and 213, respectively. Thus, the resonator 202a (and 202b) is comprised primarily or entirely of silicon in one embodiment.

Figure 2B:
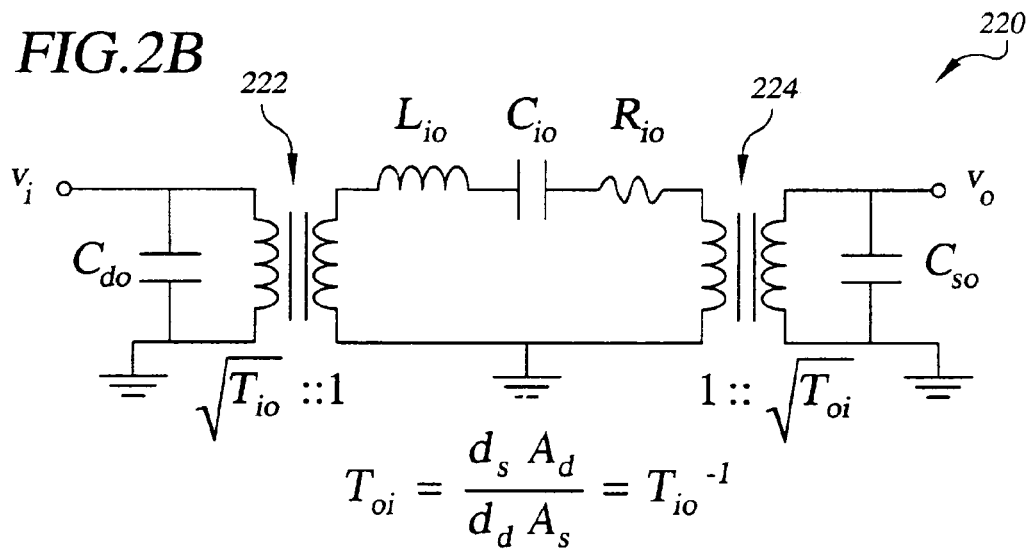
FIG. 2B is a schematic diagram of an equivalent circuit of one of the MEMS resonators shown in the electrically-coupled MEMS second order filter system of FIG. 2A.

Several equivalent circuits can be provided based on the electrically-coupled MEMS filter system 200a. FIG. 2B shows an equivalent circuit 220 for a resonator, such as resonator 202a (or similarly, for the resonator 202b), without the coupling capacitor element 204 (FIG. 2A). The equivalent circuit model 220 provides a first order filter with a pair of conjugate poles at its center frequency. The equivalent motional resistance of the resonator can be determined by the area of the sense and drive electrodes, the capacitive gap sizes between the electrodes and the resonator, the applied direct current (DC) polarization voltage (not shown), and the Q of the resonator. The transformers 222 and 224 at the terminations of the circuit 220 account for asymmetry between the sense and drive electrodes that may result in different input and output impedance levels. The gain ($T_{oi}$) can be expressed as:

$$T_{oi}=[d_sA_d]/[d_dA_s]=T_{io}^{-1}, \quad \text{(Eq. 1)}$$

where $d_d$, $d_s$, $A_d$ and $A_s$ are drive and sense electrode capacitive gaps and areas, respectively. For a symmetric resonator (e.g., wherein the input and output electrodes have the same size and same capacitive gap size), the equivalent circuit is reduced to a simple series RLC circuit. Simple RLC circuits will thus be used in the equivalent circuit analysis of the electrically-coupled MEMS filter system 200a and subsequent systems described herein.

Figure 2C:
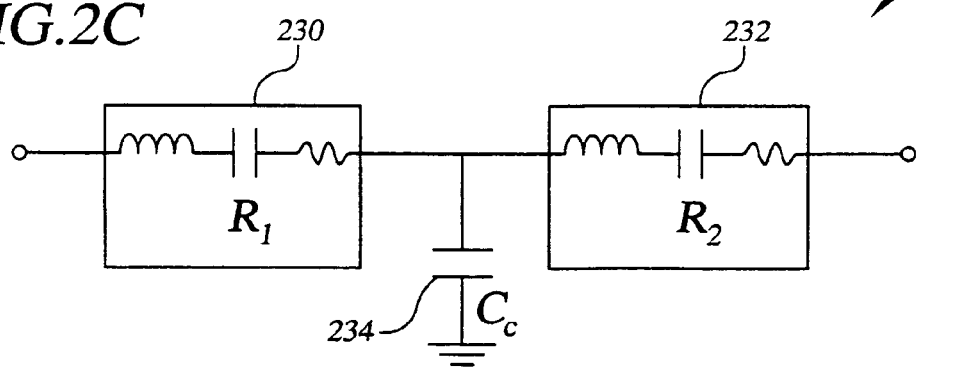
FIG. 2C is a schematic diagram of an equivalent circuit for the electrically-coupled MEMS second order filter system of FIG. 2A.
Figure 2D:
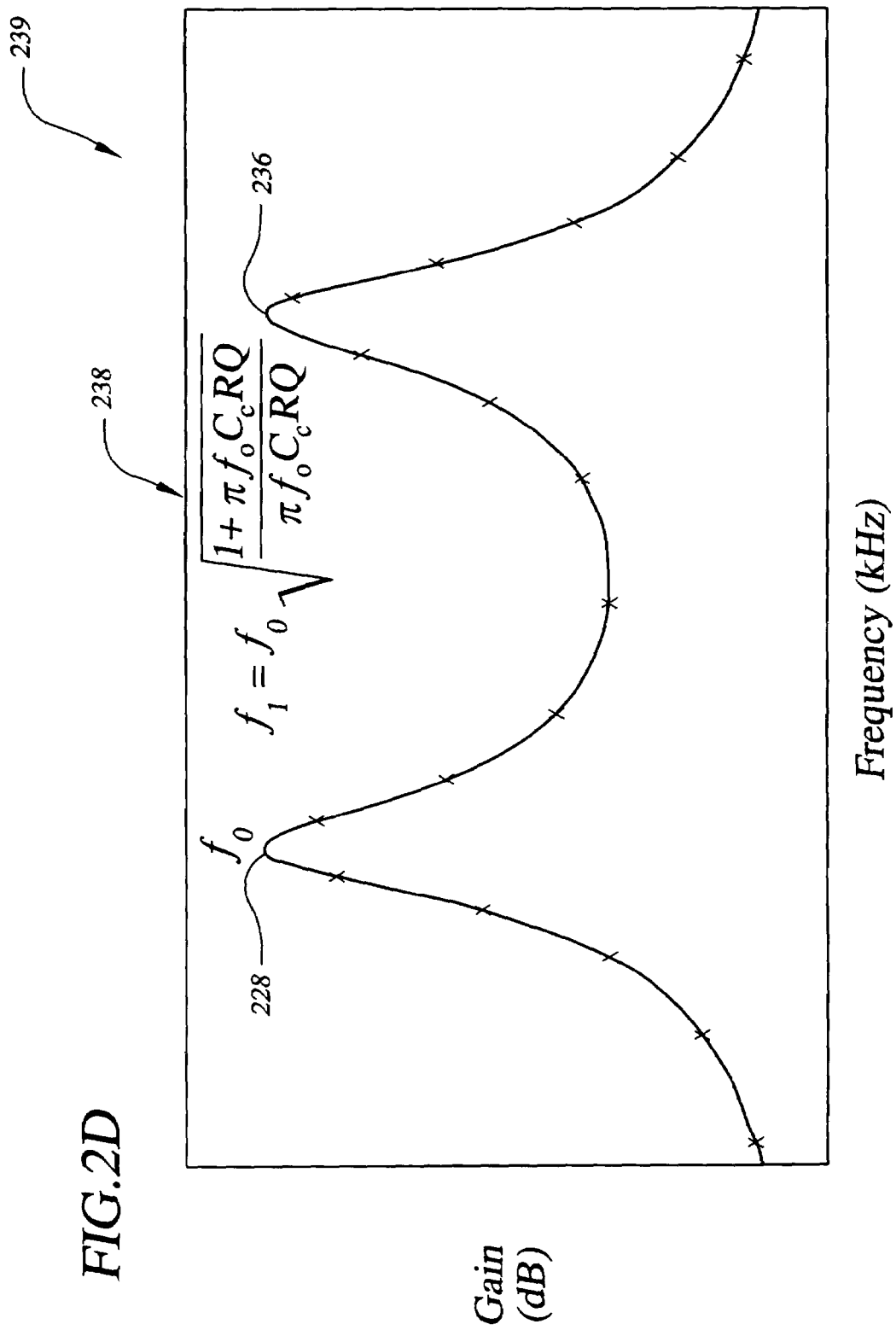
FIG. 2D is a graph illustrating the frequency response of the electrically-coupled MEMS second order filter system of FIG. 2A.

In the filter synthesis methods of the preferred embodiments and filter systems implementing these methods, the interaction of coupling capacitors and the equivalent RLC circuits of the resonators can result in several resonance modes in the system and consequently a multiple-order bandpass frequency response. With continued reference to FIG. 2A throughout FIGS. 2C–2D, FIG. 2C shows the equivalent circuit 226 for the electrically-coupled MEMS resonator system 200a, assuming symmetry as described above. As shown in FIG. 2C, the resonators 202a and 202b (of FIG. 2A) are represented by RLC circuits 230 and 232 (labeled $R_1$ and $R_2$), and the coupling capacitor element 204 is represented by coupling capacitor ($C_c$) 234. At the $1^{st}$ resonance mode, the two resonators 202a, 202b (represented by RLC circuits 230 and 232) resonate in phase and the coupling capacitor element 204 (represented by capacitor $C_c$ 234) has zero net current flowing through it (i.e., while coupling capacitor element 204 is being charged by the first resonator 202a, the other resonator 202b is discharging it).

At the $2^{nd}$ resonance ($f_1$), the two resonators 202a, 202b (represented by RLC circuits 230 and 232) operate with a 180° phase difference and hence the coupling capacitor element 204 (represented by coupling capacitor $C_c$ 234) is being charged and discharged at the same time by both resonators 202a, 202b. Due to its symmetry, the equivalent circuit 226 representing electrically-coupled MEMS filter system 200a for the second mode can be reduced to an equivalent circuit that includes two half circuits (not shown), with each half circuit including one resonator equivalent circuit and a series capacitor $C_c/2$ to ground as would be understood by one having ordinary skill in the art.

FIG. 2D is a graph 239 showing transmission gain (in decibels, or dB) versus frequency (in kilo-Hertz, or kHz). The graph 239 shows the first resonance mode response curve 228 and the second resonance mode response curve 236 for the electrically-coupled MEMS filter system 200a. In such a two-resonator system 200a, the electrical coupling of the two resonators 202a and 202b (via shunt capacitors) with identical center frequencies ($f_0$), quality factors approximately greater than 1000, and motional resistances (R) results in a new pair of conjugate poles at the frequency of:

$$f_1 = f_0\sqrt{\frac{1+\pi f_0 C_c RQ}{\pi f_0 C_c RQ}} \quad \text{(Eq. 2)}$$

where $C_c$ is the shunt coupling capacitor element 204. This will introduce a new resonance mode in addition to the inherent resonance mode of the individual resonators 202a or 202b at $f_0$. The first resonance occurs at the mechanical resonant frequency of the individual resonators 202a or 202b (again, assuming symmetrical resonators), as shown by curve 228 in FIG. 2D. The second resonance can be determined through the equation 238, and has a corresponding response curve 236 as shown in FIG. 2D.

Figure 3A:
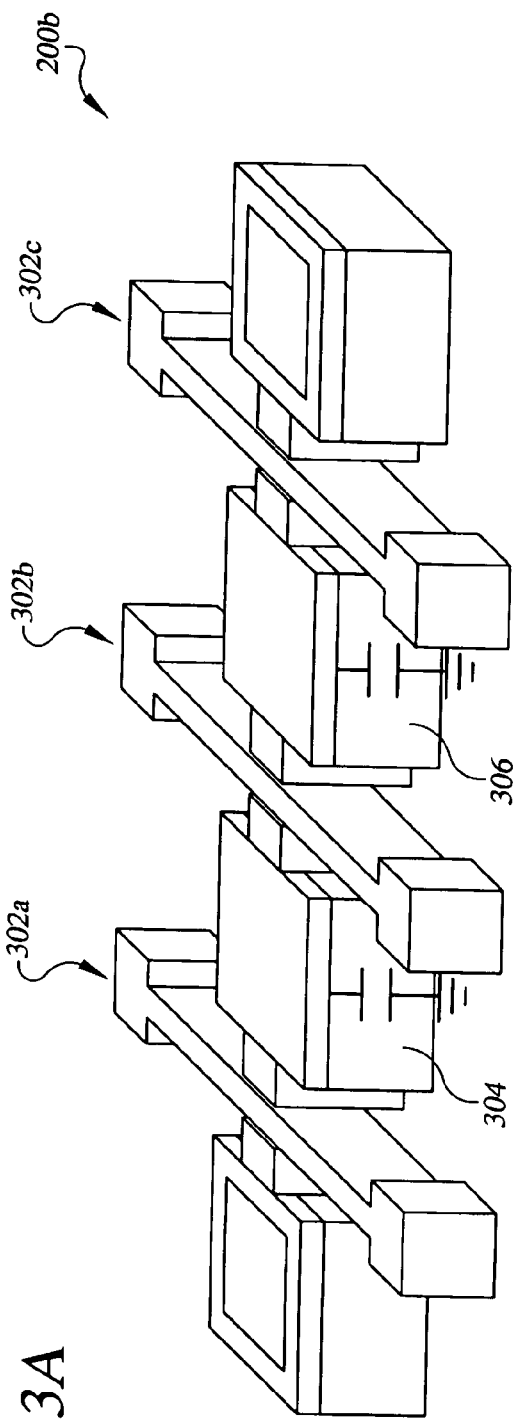
FIG. 3A a schematic diagram of an embodiment of an example electrically-coupled MEMS third order filter system.
Figure 3B:
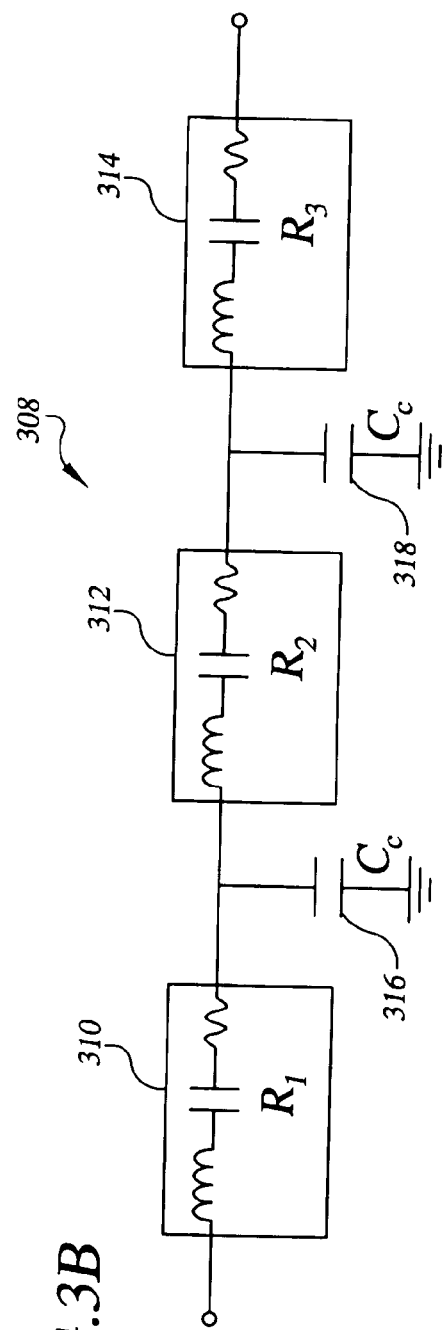
FIG. 3B is a schematic diagram of an equivalent circuit for the electrically-coupled MEMS third order filter system of FIG. 3A.
Figure 3C:
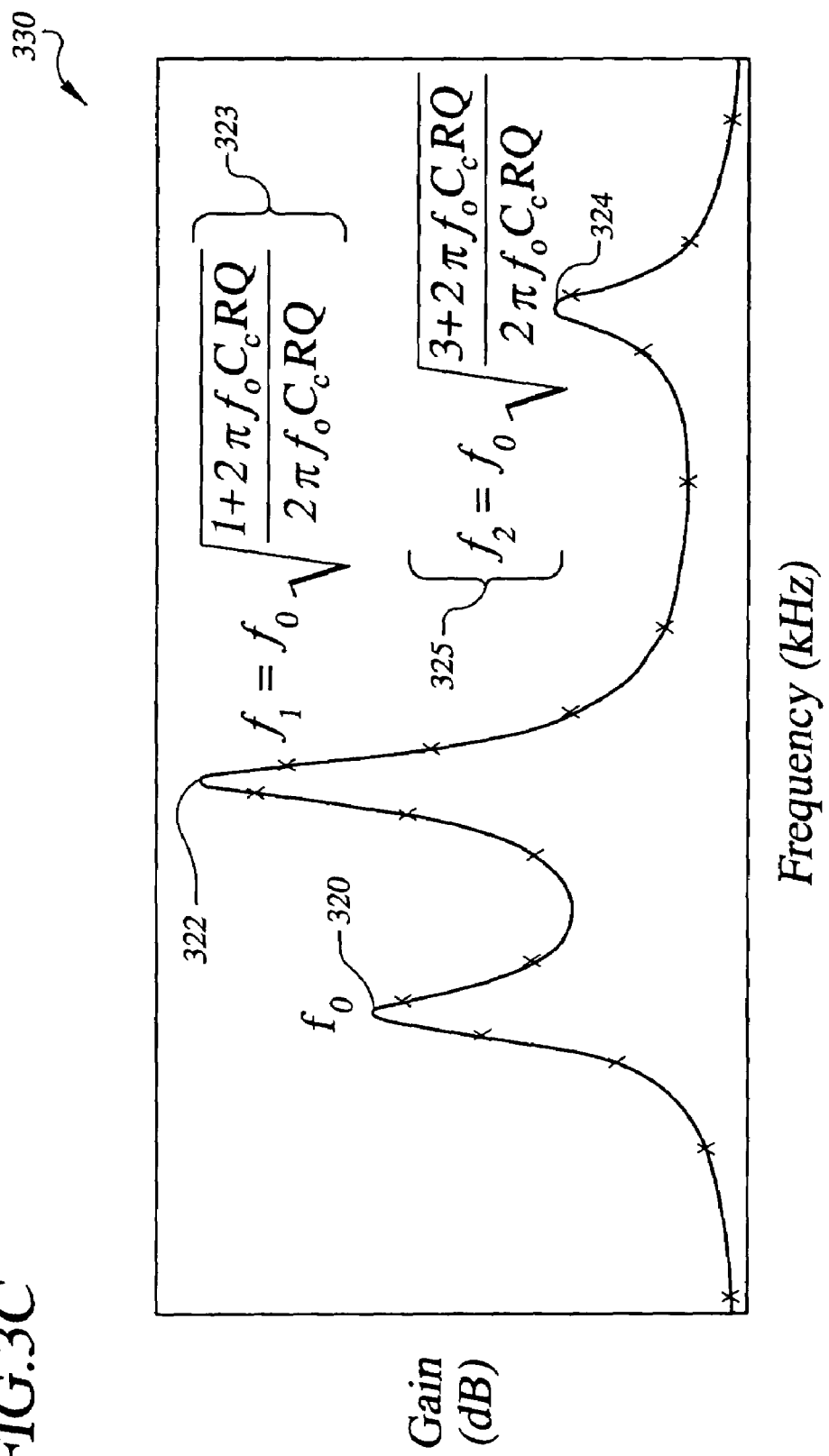
FIG. 3C is a graph illustrating the frequency response of the electrically-coupled MEMS third order filter system of FIG. 3A.

FIGS. 3A–3C show an embodiment of an example third order electrically-coupled MEMS filter system, as well as an equivalent circuit and frequency responses. FIG. 3A is a schematic diagram of the electrically-coupled MEMS third order filter system 200b, which includes resonators 302a, 302b, and 302c. The resonators are coupled via a first coupling capacitor element 304 disposed between resonators 302a and 302b, and a second coupling capacitor element 306 disposed between resonators 302b and 302c.

With continued reference to FIG. 3A throughout the discussion of FIGS. 3B–3C, FIG. 3B shows an equivalent circuit 308 for the third order electrically-coupled MEMS resonant filter system 200b. The equivalent circuit 308 includes RLC circuits 310, 312, and 314 (labeled $R_1$, $R_2$, $R_3$) corresponding to resonators 302a, 302b, and 302c, respectively. Coupling capacitor elements 304 and 306 (of FIG. 3A) are represented by coupling capacitors ($C_c$) 316 and 318. Coupling capacitor 316 electrically couples RLC circuit 310 to RLC circuit 312. Coupling capacitor 318 electrically couples RLC circuit 312 to RLC circuit 314. Similar to the description for FIGS. 2B–2D, in the first resonance mode (reflected by response curve 320 shown in the graph 330 of FIG. 3C), the resonators 302a–c (represented by RLC circuits 310–314) resonate in phase, canceling currents flowing through coupling capacitor elements 304 and 306 (represented by capacitors $C_c$ 316 and 318).

For the second resonance mode, having a response curve 322 as shown in the graph 330 of FIG. 3C, the equivalent circuit 308 of FIG. 3B becomes two half circuits (not shown) having RLC circuits 310 and 314 and coupling capacitors 316 and 318 with no current flow through RLC circuit 312. The two resonators 302a and 302c represented by RLC circuits 310 and 314 resonate out-of-phase (180° phase difference), resulting in the charging and discharging of the coupling capacitor elements 304 and 306 (represented by capacitors 316 and 318) at the same or substantially the same time. The response curve 322 shown in FIG. 3C can be derived via equation 323.

For the third resonance mode, each resonator (302a–302c) is resonating out-of-phase with respect to the resonator adjacent to it, resulting in the response curve 324 as shown in the graph 330 of FIG. 3C, and can be determined algebraically from equation 325 (FIG. 3C).

Figure 4A:
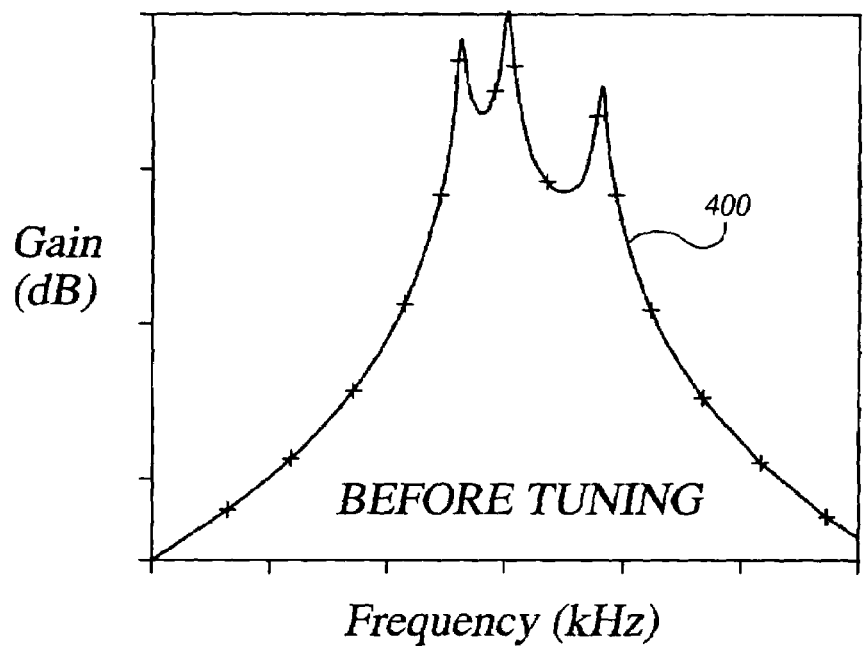
FIGS. 4A–4C are graphs illustrating simulated frequency responses of an example electrically-coupled MEMS third order filter system as a result of implementing various circuit techniques.
Figure 4B:
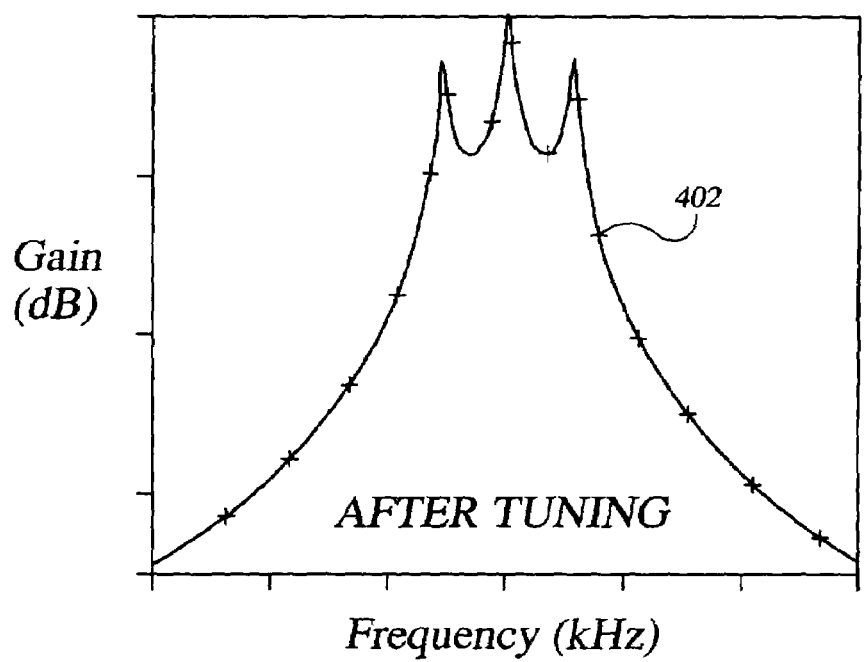

The asymmetry in the frequency responses shown in the graph 330 (FIG. 3C) of the third order filter system 200b (FIG. 3A) is due at least in part to the end resonators 302a and 302c (FIG. 3A) having only one coupling capacitor element (either 304 or 306, FIG. 3A) coupled to them but the resonator 302b (FIG. 3A) in the middle is terminated with two coupling capacitor elements 304 and 306 at the two ends. FIG. 4A shows a simulated frequency response curve 400 for an example third order electrically-coupled MEMS filter system, such as the electrically-coupled MEMS third order filter system 200b shown in FIG. 3A. The asymmetry can be compensated for by a slight frequency tuning of the end resonators (e.g., 302a and 302c, FIG. 3A), the result of which is shown by the simulated response curve 402 shown in FIG. 4B. The slight tuning of the end resonators can result in an increase in the insertion loss. Another solution to addressing this asymmetry is to use a closed chain of coupled resonators to have complete symmetry for all the resonators.

Figure 4C:
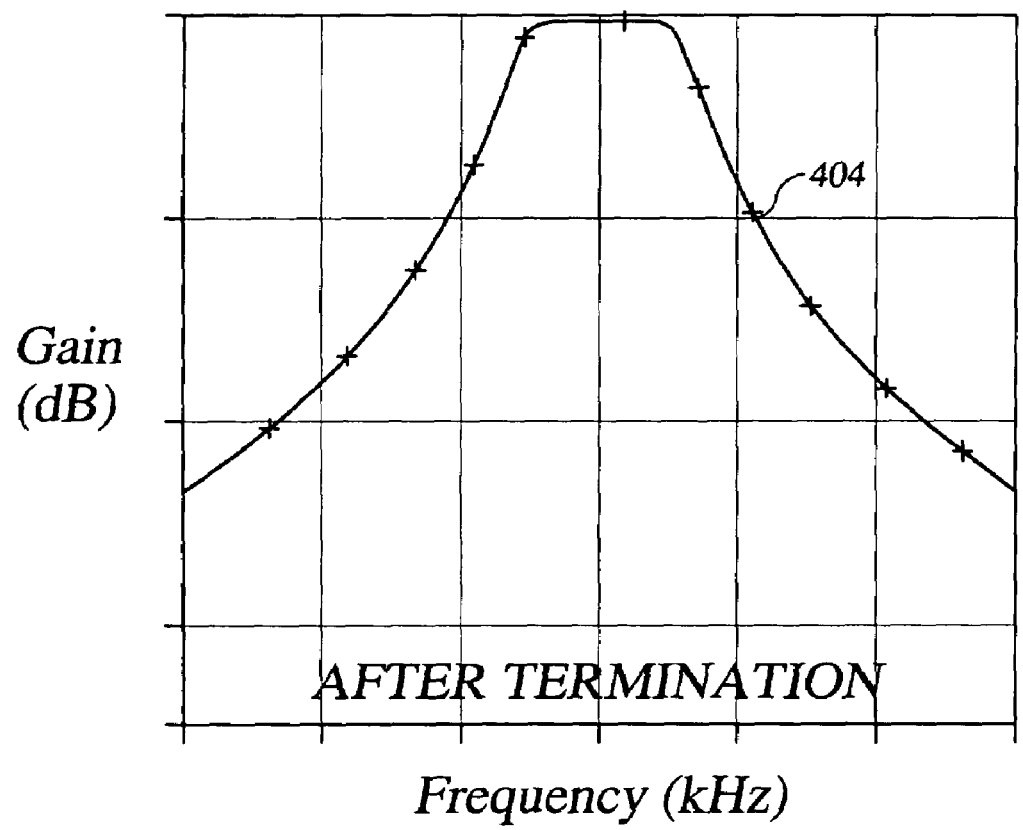

Continuing the discussion of the example electrically-coupled MEMS third order system that is the subject of curves 400 and 402 (FIGS. 4A and 4B, respectively), FIG. 4C shows a simulated frequency response curve 404 where the passband is flattened via the input and output resistance of other system components (e.g., input or output resistance of an RF amplifier, etc.) that interface with the electrically-coupled MEMS filter system as would be understood in the context of this description by those having ordinary skill in the art.

The insertion loss of electrically-coupled MEMS filters (assuming ideal lossless coupling capacitors) is determined primarily by the Q of the individual resonators, the order of the filter, and any termination resistors (e.g., of interfacing components or systems) added to flatten the passband:

$$\text{Insertion} - \text{Loss (dB)} = 20 \log\left(\frac{nR_r + 2R_{term}}{2R_{term}}\right) \quad \text{(Eq. 3)}$$

where n is the order of the filter, $R_r$ is the equivalent motional resistance of the resonators ($R_r \propto 1/Q$), and $R_{term}$ is the termination resistor value. The insertion loss is generally understood as the ratio of input power to the filter to the output power attained from the filter. The finite Q of the coupling capacitors does not have a significant effect on the first resonance peak but its attenuation effect becomes more pronounced in higher resonance modes, primarily because the contribution of the coupling capacitors becomes greater (e.g., as described above, in the first mode, the coupling capacitors have no contribution). In other words, capacitors are generally not ideal, and thus have a small resistance associated with the capacitor (e.g., approximately 0.1–1.0 ohms in value). This finite resistance value causes a decrease in Q (whereas Q would be infinite in an ideal capacitor).

Figure 5A:
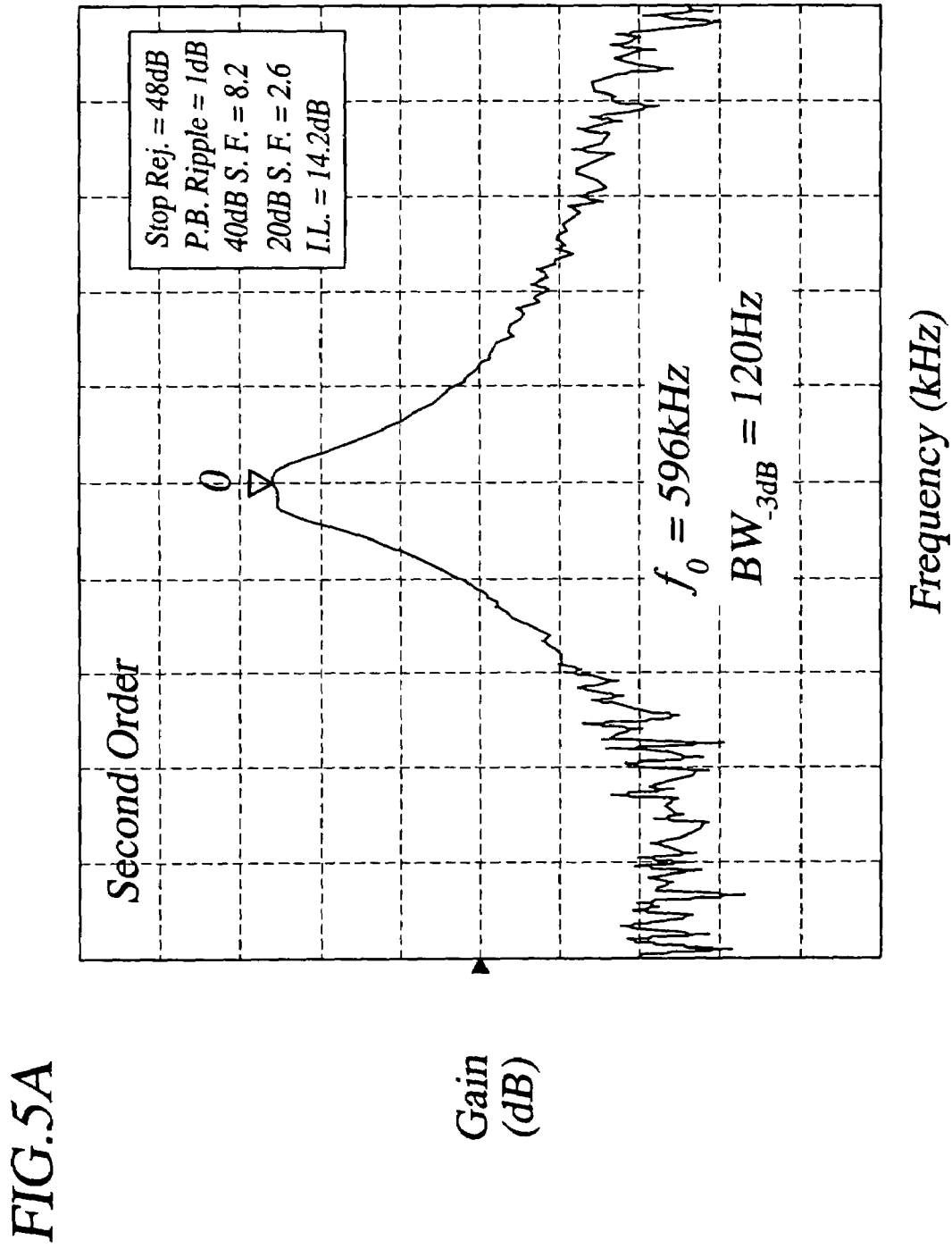
FIG. 5A is a graph illustrating the measured frequency response of an example electrically-coupled MEMS second order filter system.

Two 600 kHz HARPSS (high aspect ratio combined poly and single crystal silicon)-fabricated resonators were mounted and wire-bonded on a printed circuit board (PCB) containing a low-noise junction-field effect transistor (JFET)-input amplifier to sense the output signal of the electrically-coupled MEMS second order filter system, similar to that shown in FIG. 2A. The PCB was placed in a vacuum system, which kept the pressure below 1 mTorr. The output port of the first resonator was directly connected to the second resonator through wirebonds and the metal track on the PCB and the frequency response of the filter system was measured using a network analyzer. Note that similar testing has been performed with fully-integrated, electrically-coupled MEMS filter systems with improved performance with respect to insertion losses. The parasitic capacitances introduced by the wire-bonds and the PCB in addition to the large pad capacitors of the resonators (~1 pF) resulted in a total coupling capacitor having a capacitance of ~3 pF. With such a large coupling capacitor, separation of the two resonance peaks was less than the bandwidth of the individual resonators. The large capacitor attenuated the signal, resulting in a larger insertion loss. To obtain a larger bandwidth, the two resonance peaks were separated by adjusting the applied DC polarization voltages, which resulted in an increased insertion loss as shown in FIG. 5A. Note that Stop Rej. stands for "Stopband Rejection", and is the attenuation provided by the filter for out of band signals. P. B. Ripple stands for "passband ripple" and is the amplitude of the fluctuations in the filter insertion loss in the passband. 20 dB and 40 dB S. F. stand for "20 dB and 40 dB shape factor" respectively, which are the ratio of the 20 dB or 40 dB bandwidths to the 3 dB bandwidth of the filter.

Figure 5B:
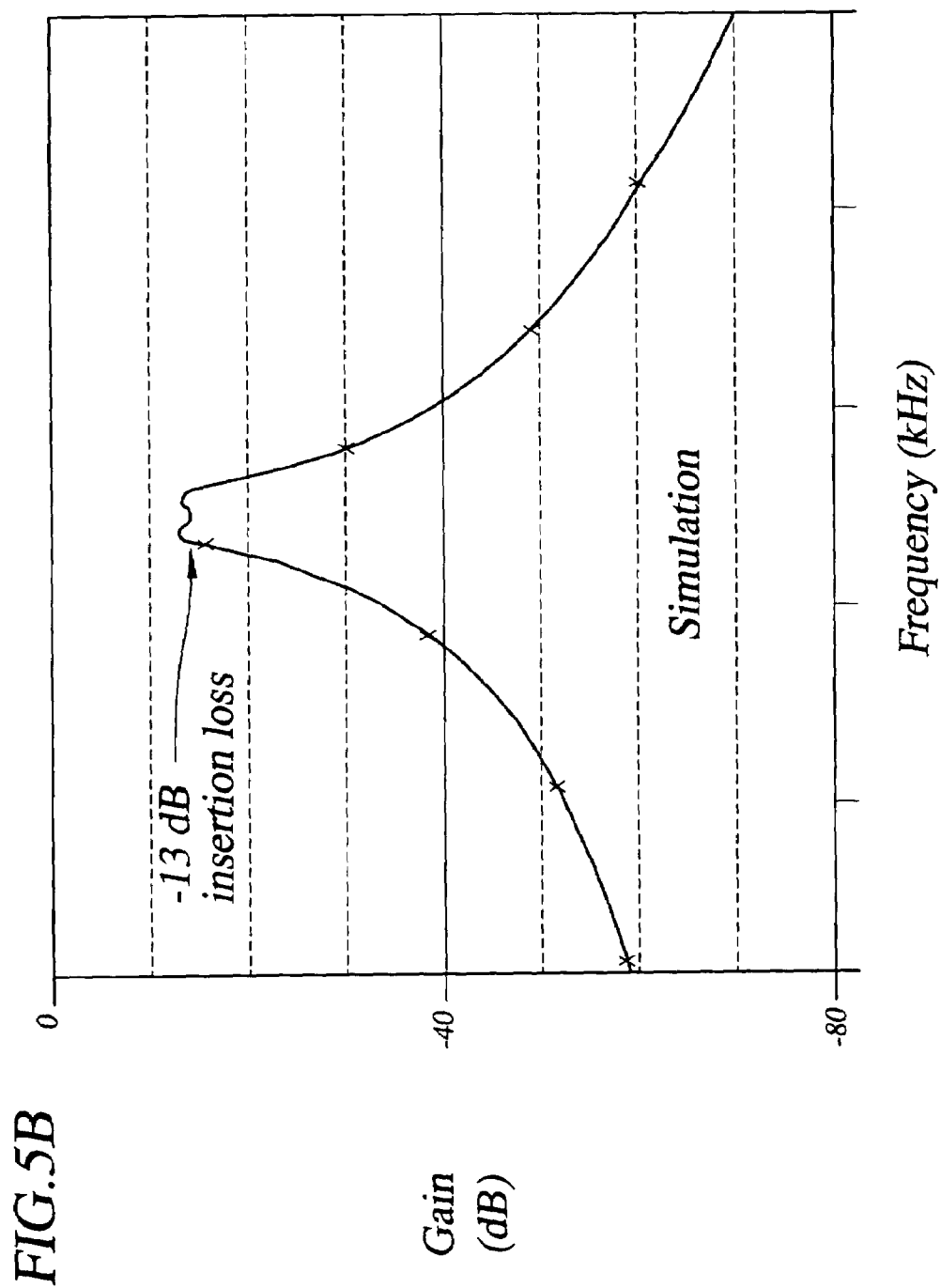
FIG. 5B is a graph illustrating the simulated frequency response corresponding to the example MEMS second order filter system represented in the graph of FIG. 5A.

Contribution of the parasitic capacitance (3 pF) in increasing the insertion loss of the filter was confirmed by simulation, as shown in FIG. 5B. On-chip implementation of the coupling capacitors (e.g., integrated) can reduce the insertion loss of the filter to less than 2 dB, as suggested above.

Figure 6A:
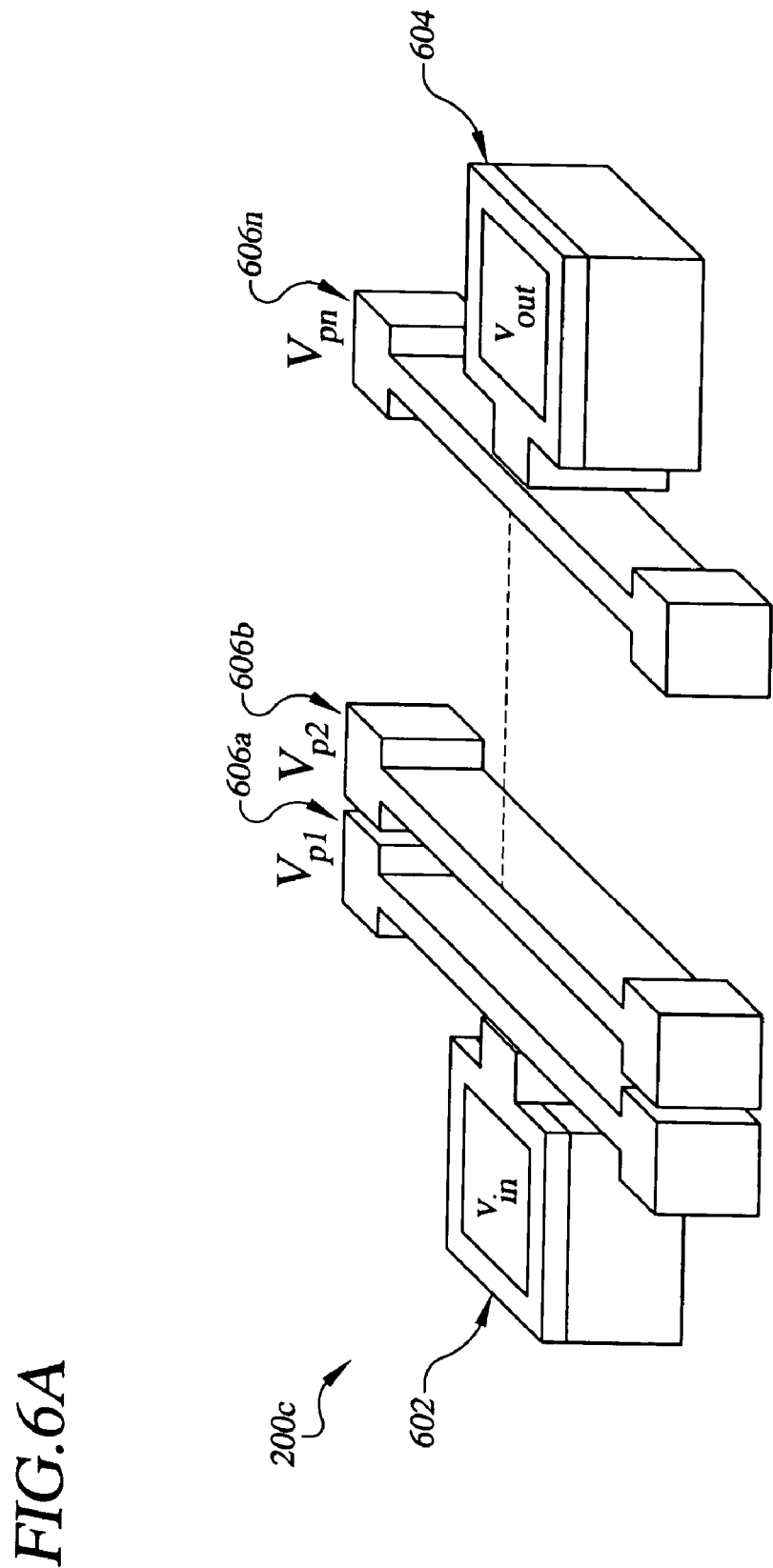
FIG. 6A is a schematic diagram illustrating an embodiment of an example series-configured, electrically-coupled MEMS n-th order filter system.

FIG. 6A is a schematic diagram illustrating an embodiment of an example series configured, electrically-coupled MEMS n-th order filter system. As shown, the electrically-coupled MEMS filter system 200c includes drive and sense electrodes 602 and 604, and closely-placed resonators 606a, 606b, and 606n (with n representing an integer number corresponding to a plurality of resonators). The electrically-coupled MEMS filter system 200c provides for electrical-coupling of the closely-placed resonators (606a–n) through the action of the "series" capacitance between the body of adjacent resonators without the need for an additional coupling element (e.g., coupling capacitor element 204 of FIG. 2A).

Applying different polarization voltages ($V_p$) to the adjacent resonators (606a–n) causes electrostatic interaction in between them, which in the mechanical domain can be modeled by a distributed spring with total negative stiffness:

$$K_{elec} = -\frac{\Delta V_p^2 \varepsilon h_r L_r}{d_c^3} \quad \text{(Eq. 4)}$$

where $\Delta V_p$ is the difference in the polarization voltages applied to the adjacent resonators (606a–n), $\varepsilon$ is the permitivity coefficient of the surrounding environment, $d_c$ is the coupling gap spacing between the two resonators, and $h_r$ and $L_r$ are the height and length of the coupled beams of resonators 606a–n. This effect is somewhat similar to the electrical frequency tuning of parallel-plate actuated resonators where each electrode adds a negative stiffness to the resonator reducing its resonance frequency. The electrostatic negative stiffness (spring) between the resonators has a similar coupling capability as mechanical coupling elements. In contrast to the mechanical coupling approach where the coupling strength and consequently the filter bandwidth is determined by the stiffness and position of the coupling element, the coupling strength in the electrically-coupled MEMS filter system 200c is a strong function of the DC polarization voltages applied to the resonators (606a–n) in addition to the geometric parameters (e.g., gap size and coupling area), and can be easily adjusted to the required value by changing the polarization voltages. Note that the above-mentioned embodiment 200c is just an example embodiment among others, and the aforementioned synthesis techniques can be applied to other types of resonators such as block resonators.

Figure 6B:
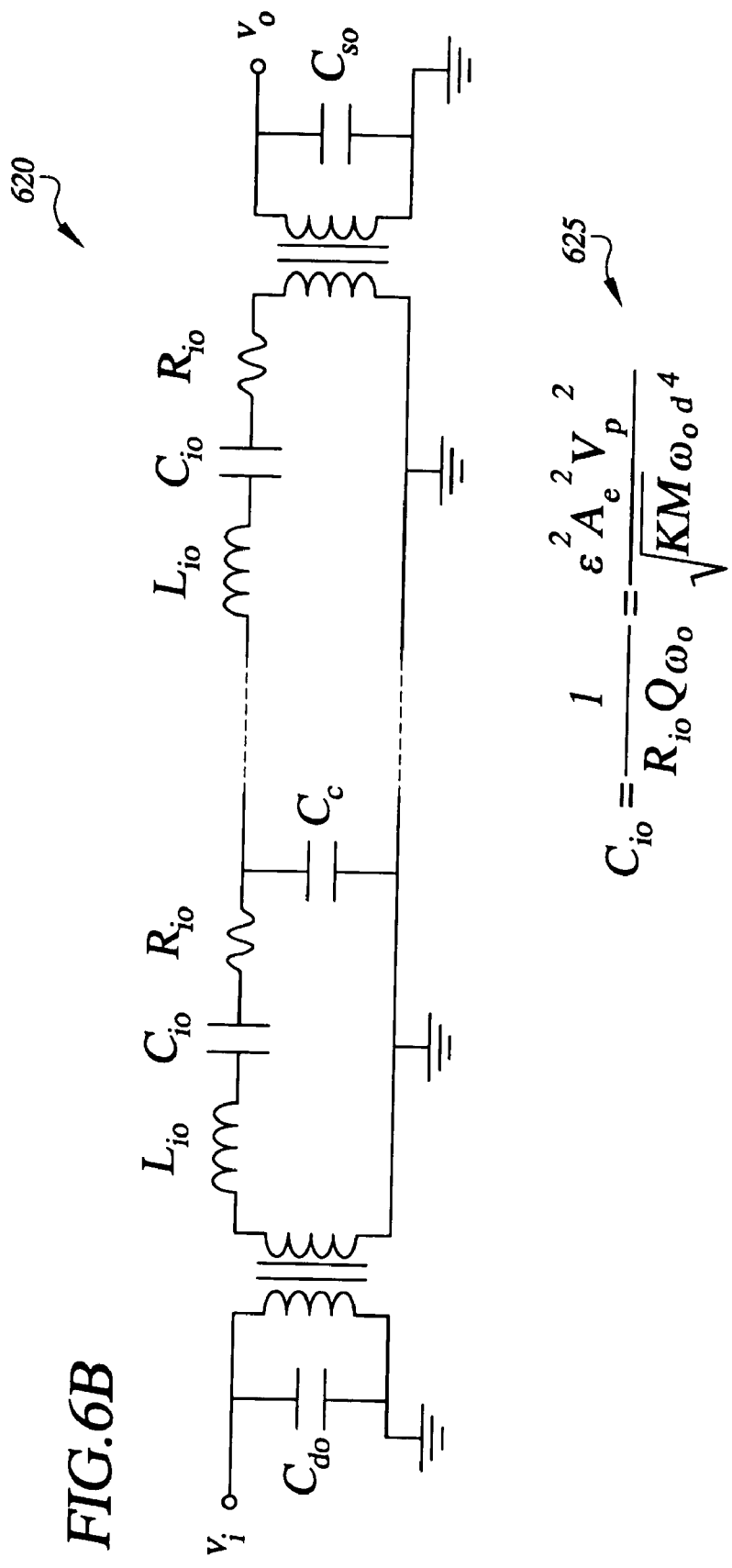
FIG. 6B is a schematic diagram of an equivalent circuit for the series-configured, electrically-coupled MEMS n-th order filter system of FIG. 6A.
Figure 6C:
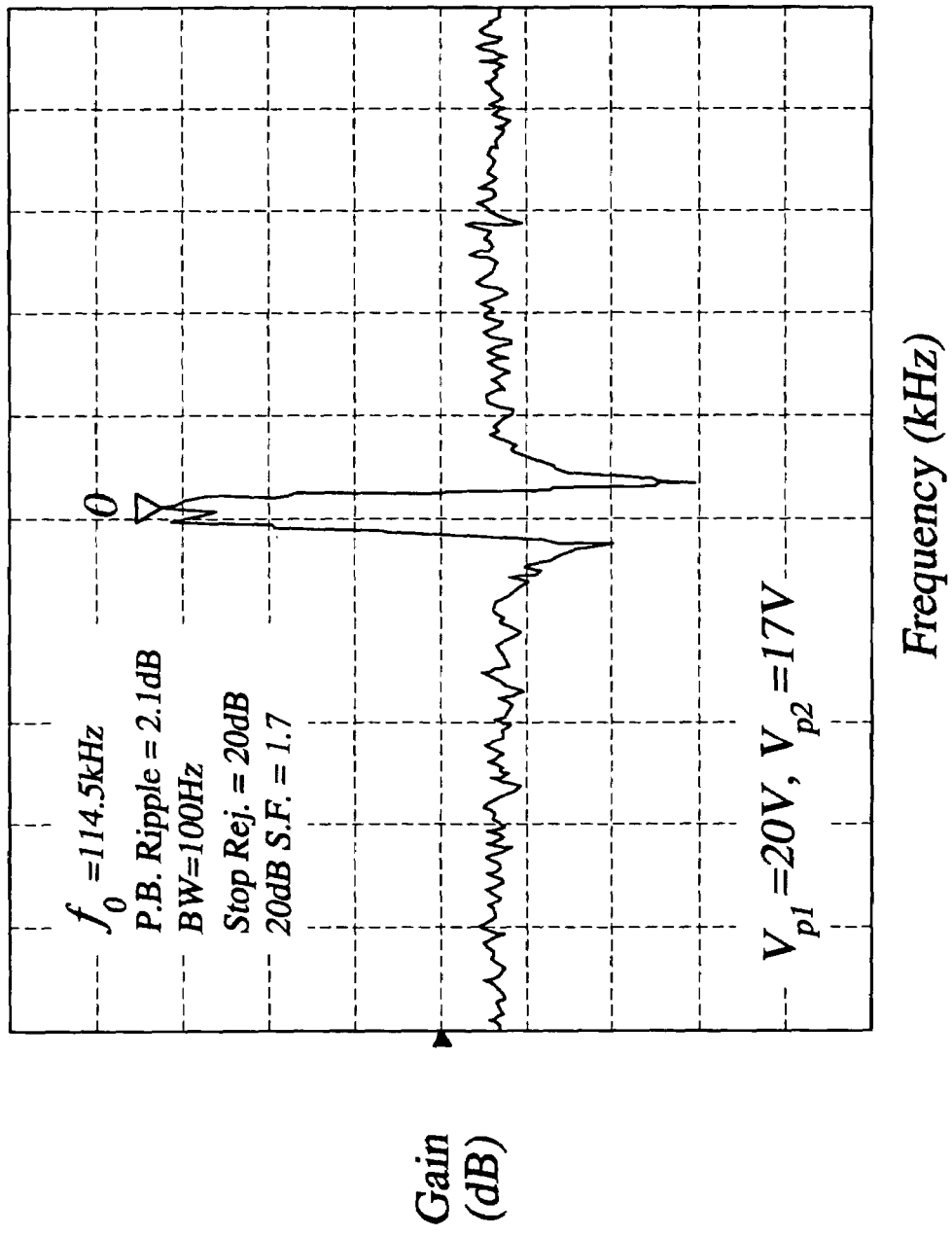
FIG. 6C is a graph that illustrates the measured frequency response of the electrically-coupled MEMS filter system of FIG. 6B.

FIG. 6B shows the electrical equivalent circuit 620 for the electrically-coupled MEMS filter system 200c. To convert this mechanical system to an electrical equivalent circuit with series RLC circuits as the resonators, stiffness is converted to capacitance, mass to inductance, and the loss element to resistance (K→1/C, M→L, and D→R). Therefore, current in the electrical equivalent circuit 620 represents displacement of the resonators (e.g., 606a–n) and the derivative of voltage represents force. Since the force applied by the coupling stiffness is determined by the sum of the two resonators' displacements, the coupling element (e.g., series capacitance) is represented by a shunt capacitor (having value $C_c$), at the coupling node in between the two resonators so that the sum of the currents of the resonators will determine the coupling capacitor's ($C_c$) voltage. Due to similarity of the equivalent electrical circuits for the series and shunt configurations, system performance and formation of different resonance modes for the series configuration is similar to that described and illustrated for the shunt-configured filters. The value of the coupling capacitor capacitance, $C_c$, in the equivalent circuit model 620 for the series configured filter is, $$C_c = \frac{C_{io} K_{mech.eff}}{K_{elec}} \quad \text{(Eq. 5)}$$

where $C_{io}$ (see equation 625 in FIG. 6B) is the resonators' equivalent motional capacitance, $K_{mech.eff}$ is the resonators' effective stiffness and $K_{elec}$ is the effective negative stiffness provided by the electrostatic coupling between the adjacent resonators as described. FIG. 6C is a graph that illustrates the measured frequency response of the electrically-coupled MEMS filter system 200c. Filter performance of the series-configured electrically-coupled MEMS filter system 200c is similar to that described and illustrated for the shunt-configured electrically-coupled MEMS filter systems 200a (FIG. 2A) and 200b (FIG. 3A).

Figure 7:
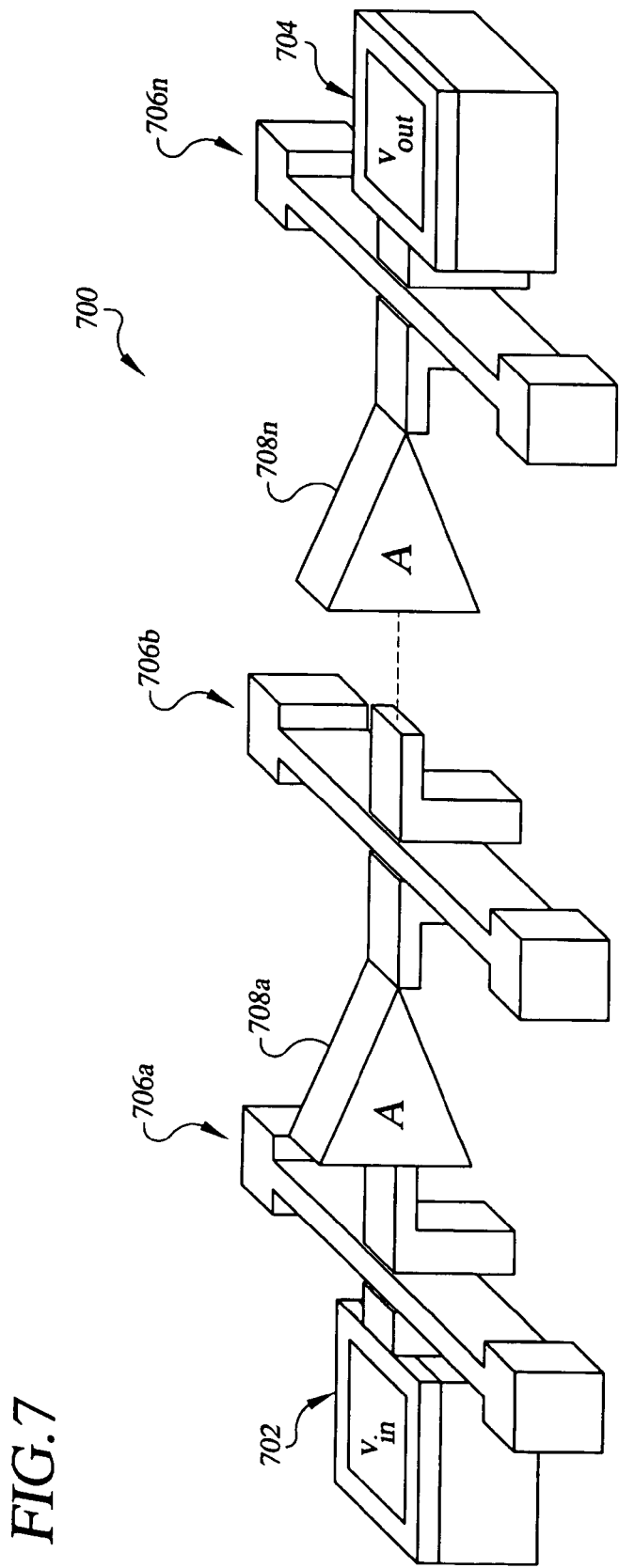
FIG. 7 is a block diagram illustrating an embodiment of an example electrically-coupled MEMS active filter system.

FIG. 7 is a schematic diagram illustrating an embodiment of an example electrically-coupled MEMS active filter system. The example electrically-coupled MEMS active filter system 700 includes a drive electrode 702, sense electrode 704, resonators 706a, 706b, and 706n, and active amplifying circuits 708a, 708n. The resonators are cascaded with active amplifying circuits (e.g., 708a–n) disposed in between each resonator (e.g., 706a–n). For example, active amplifying circuit 708a is disposed between resonator 706a and resonator 706b. The active amplifying circuit 708a, for example, can be a transistor. Multiple order filters can be achieved through the multiplication of transfer functions that correspond to each resonator-active amplifying circuit-resonator stage (e.g., 706a–708–706b for the second order filter).

Figure 8A:
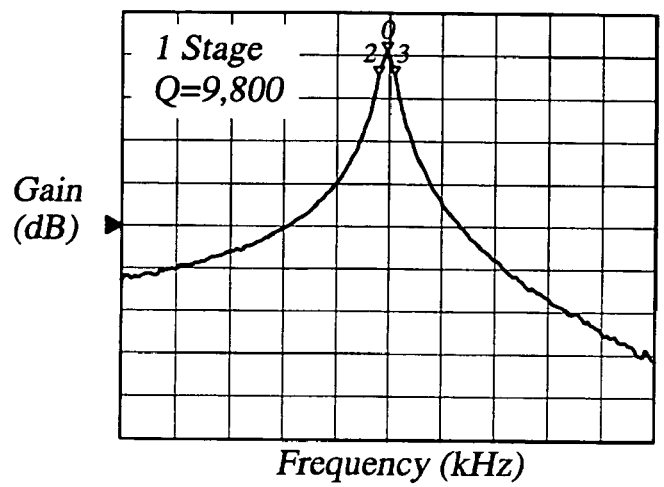
FIGS. 8A–8C are graphs illustrating Q-amplification for the electrically-coupled MEMS active filter system of FIG. 7.
Figure 8B:
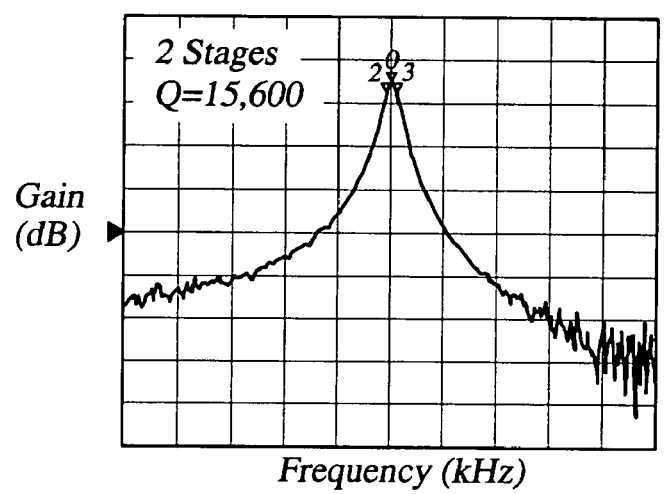
Figure 8C:
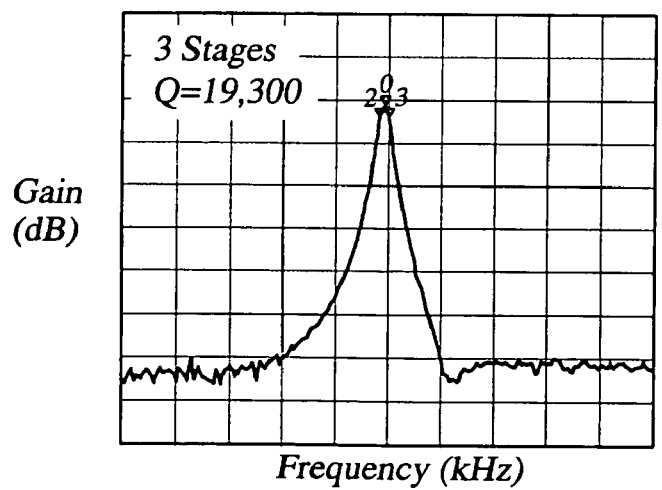

Electrical cascading of resonators with electronic amplifiers in between results in higher-order transfer functions and improved selectivity. When the resonators have equal center frequencies, cascading results in sharper (e.g., narrower bandwidths and higher Q's) resonance peaks and hence higher Q. FIGS. 8A–8C are graphs of transmission gain versus frequency, reflecting Q-amplification as stages with equal resonance frequencies are cascaded. An overall quality factor of approximately two times higher than individual resonators has been achieved by electrical cascading of three identical resonators using interface circuits to cancel loading effects of stages on each other. The total Q for different numbers of cascaded stages (as shown by stages 1–3 in FIGS. 8A–8C, respectively) can be determined as follows:

$$Q_{tot} = Q_i / [(10^{0.3/n} - 1)]^{1/2} \quad \text{(Eq. 6)}$$

$Q_i$ is the Q of each resonator stage, and n is the number of stages. If n becomes large, Eq. 6 becomes $$Q_{tot} = 1.2(n)^{1/2}(Q_1) \quad \text{(Eq. 7)}$$

The resonators 706a, 706b, and 706n (FIG. 7) can be tuned to the required center frequencies by adjusting an applied polarization voltage (e.g., applied to each resonator 706a, 706b, 706n) to achieve different filter characteristics.

Figure 9A:
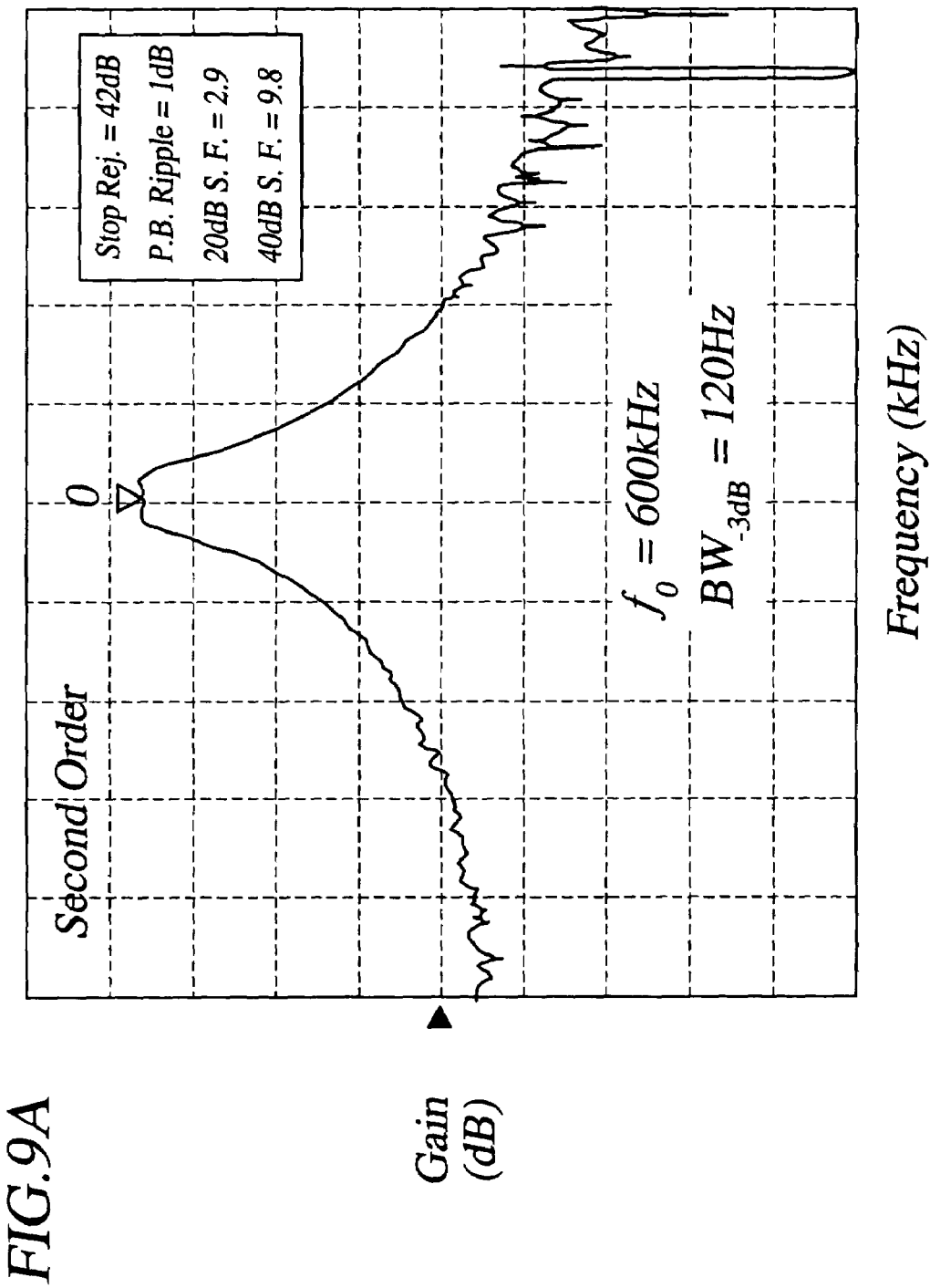
FIGS. 9A–9B are graphs illustrating the frequency response of the electrically-coupled MEMS active filter system of FIG. 7.
Figure 9B:
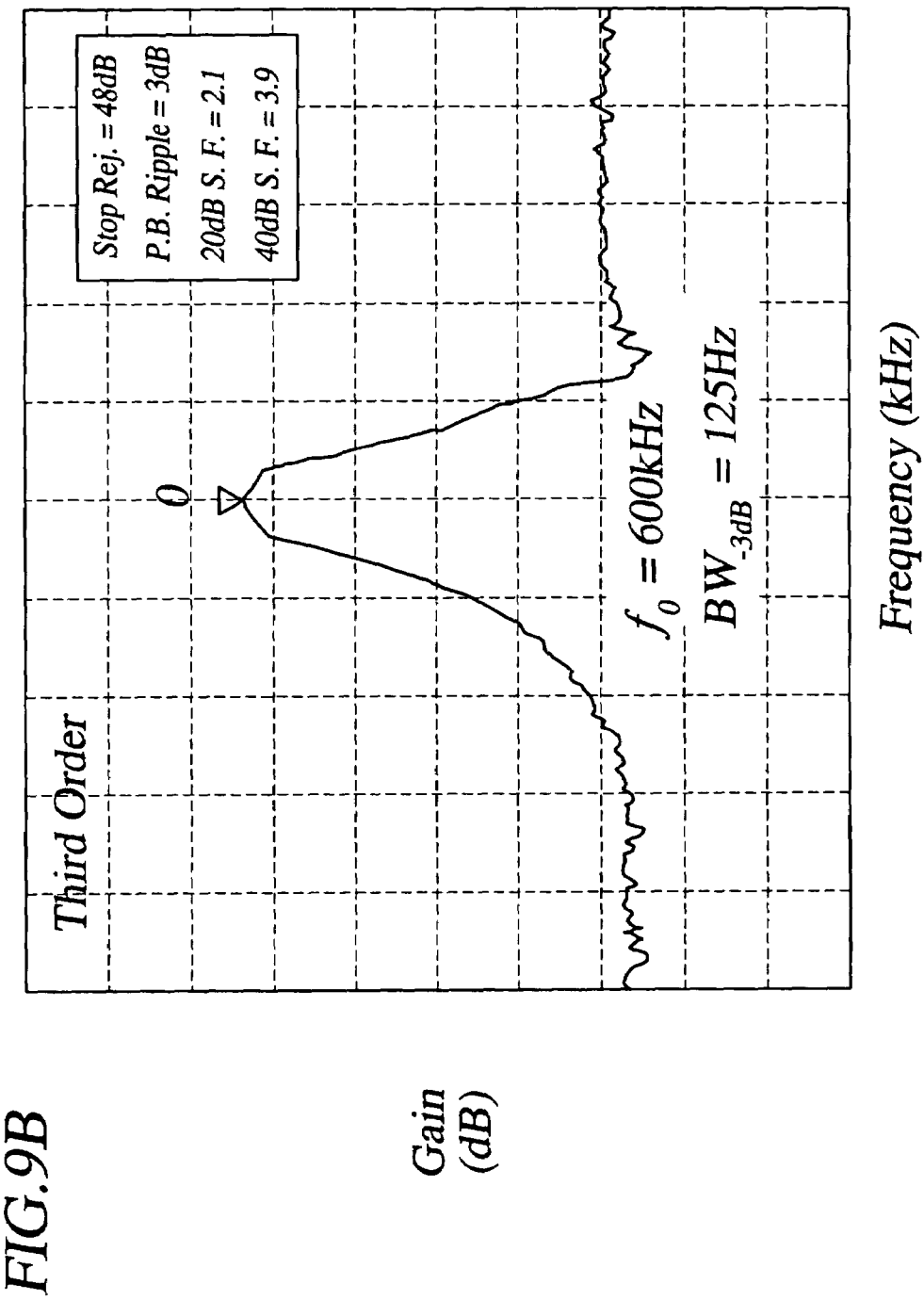

FIGS. 9A–9B are graphs illustrating the frequency response of the electrically-coupled MEMS active filter system 700 of FIG. 7. The electrically-coupled MEMS active filter system 700 is operated in a filter mode (as opposed to Q-amplification) by adjusting the center frequency of each resonator 706a, 706b, and 706n (FIG. 7) to a different frequency (e.g., different from each other resonator). Larger bandwidths are achieved by adjusting the polarization voltages applied at each resonator (706a–n), which can result in a decrease in gain. FIG. 9A is a frequency response for an electrically-coupled MEMS second order active filter system and FIG. 9B is for an electrically-coupled MEMS third order active filter system. As shown, the third order filter has a lower shape factor (higher selectivity) and higher stopband rejection than the second order filter.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A communications device, comprising:
   a receiver; and
   a microelectromechanical system (MEMS) filter system disposed in the receiver,
      the MEMS filter system comprising:
      a first filter, including:
         a first MEMS resonator and a second MEMS resonator; and
         a coupling element disposed between the first and the second MEMS resonators and mechanically separate from the resonating portions of the resonators, wherein the second MEMS resonator, the first MEMS resonator, and the coupling element are electrically coupled.

2. A microelectromechanical system (MEMS) filter system, comprising:
a first microelectromechanical system (MEMS) resonator comprising a first resonating element;
a second MEMS resonator comprising a second resonating element, the second resonating element closely spaced and mechanically separate from the first resonating element, wherein the first MEMS resonator is coupled to the second MEMS resonator through the electrostatic force acting between resonating portions of the MEMS resonators; and
one or more additional MEMS resonators electrically coupled to the first MEMS resonator, the second MEMS resonator, or the first and second MEMS resonators.

3. The system of claim 1, wherein the electrical coupling between the first MEMS resonator and the second MEMS resonator includes an effective shunt capacitance to ground.

4. The system of claim 1, wherein the first MEMS resonator is capacitively coupled to the second MEMS resonator.

5. The system of claim 1, wherein the first MEMS resonator and the second MEMS resonator are conductive.

6. The system of claim 1, further including a direct current (DC) voltage source, a first terminal coupled to the first MEMS resonator, and a second terminal coupled to the second MEMS resonator, wherein a first DC potential is imposed on the first terminal and a second DC potential different from the first DC potential is imposed on the second terminal.

7. The system of claim 6, wherein responsive to the imposition of the first and second DC potentials to the first and second terminals, at least two frequency resonance peaks are elicited.

8. A microelectromechanical system (MEMS) filter system, comprising:
a first filter, including:
a first MEMS resonator and a second MEMS resonator; and
a coupling element disposed between the first and the second MEMS resonators and mechanically separate from the resonating portions of the resonators, wherein the second MEMS resonator, the first MEMS resonator, and the coupling element are electrically coupled.

9. The system of claim 8, further including at least one additional filter of like structure to the first filter, the at least one additional filter electrically coupled to and separate from the first filter.

10. The system of claim 8, wherein the first MEMS resonator and the second MEMS resonator are electrically coupled with a shunt capacitor to ground disposed between the first MEMS resonator and the second MEMS resonator, further including a direct current (DC) voltage source, a first terminal coupled to the first MEMS resonator, and a second terminal coupled to the second MEMS resonator, wherein a first DC potential is imposed on the first terminal and a second DC potential different from the first DC potential is imposed on the second terminal.

11. The system of claim 8, wherein the first MEMS resonator and the second MEMS resonator are electrically coupled using a series capacitance disposed between the resonating body of the first MEMS resonator and that of the second MEMS resonator wherein responsive to the imposition of the first and second DC potentials to the first and second terminals, at least two frequency resonance peaks are elicited.

12. The system of claim 8, wherein the first MEMS resonator and the second MEMS resonator are electrically coupled using an active component disposed between the first MEMS resonator and the second MEMS resonator.

13. The system of claim 12, wherein the active component includes an amplifier.

14. A communications device, comprising:
a receiver; and
a microelectromechanical system (MEMS) filter system disposed in the receiver,
the MEMS filter system comprising:
a first MEMS resonator comprising a first resonating element;
a second MEMS resonator comprising a second resonating element, the second resonating element closely spaced and mechanically separate from the first resonating element, wherein the second MEMS resonator is electrically coupled to the first MEMS resonator; and
one or more additional MEMS resonators electrically coupled to the first MEMS resonator, the second MEMS resonator, or the first and second MEMS resonators.

15. The communications device of claim 14, further comprising a transmitter.

16. The communications device of claim 15, wherein the transmitter comprises a second MEMS filter system, the second MEMS filter system comprising:
a third MEMS resonator comprising a third resonating element; and
a fourth MEMS resonator comprising a fourth resonating element, the fourth resonating element closely spaced and separate from the third resonating element, wherein the fourth MEMS resonator is electrically coupled to the third MEMS resonator.

17. The communications device of claim 14, further including a coupling element disposed between the first MEMS resonator and the second MEMS resonator, wherein the second MEMS resonator, the first MEMS resonator, and the coupling element are electrically coupled.

18. The communications device of claim 17, wherein the coupling element comprises an active device.

* * * * *

UNITED STATES PATENT AND TRADEMARK OFFICE
CERTIFICATE OF CORRECTION

PATENT NO. : 7,098,757 B2  
APPLICATION NO. : 10/669178  
DATED : August 29, 2006  
INVENTOR(S) : Ayazi et al.

Page 1 of 1

It is certified that error appears in the above-identified patent and that said Letters Patent is hereby corrected as shown below:

On the front page of the patent:

Item [12] - delete the inventor name "Avazi, et al." and replace with --Ayazi, et al.--

Item [75] - delete the last name of the inventor "Avazi" and replace with --Ayazi--

Signed and Sealed this

Twenty-sixth Day of December, 2006

JON W. DUDAS  
*Director of the United States Patent and Trademark Office*